(12) United States Patent
Basu et al.

(10) Patent No.: US 9,263,464 B2
(45) Date of Patent: Feb. 16, 2016

(54) FIELD EFFECT TRANSISTORS INCLUDING CONTOURED CHANNELS AND PLANAR CHANNELS

(71) Applicant: International Business Machines Corporation, Armonk, NY (US)

(72) Inventors: Anirban Basu, Ewen, NY (US); Pouya Hashemi, White Plains, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/269,525

(22) Filed: May 5, 2014

(65) Prior Publication Data

US 2015/0318303 A1  Nov. 5, 2015

(51) Int. Cl.
*H01L 27/12* (2006.01)
*H01L 21/84* (2006.01)

(52) U.S. Cl.
CPC .......... *H01L 27/1203* (2013.01); *H01L 21/84* (2013.01)

(58) Field of Classification Search
None
See application file for complete search history.

(56) References Cited

U.S. PATENT DOCUMENTS 5,710,050 A * 1/1998 Makita et al. .................. 438/486

OTHER PUBLICATIONS

Wolf, "Silicon Processing for the VLSI Era, vol. 2—Process Integration," 1990, Lattice Press, p. 12-13.*
U.S. Appl. No. 14/070,038, filed Nov. 1, 2013, entitled: "Field Effect Transistor Including a Regrown Contoured Channel" First Named Inventor: Anirban Basu.

* cited by examiner

*Primary Examiner* — Bilkis Jahan
*Assistant Examiner* — Kevin Quinto
(74) *Attorney, Agent, or Firm* — Scully, Scott, Murphy & Presser, P.C.; Louis J. Percello, Esq.

(57) ABSTRACT

Disposable gate structures and a planarization dielectric layer are formed over doped semiconductor material portions on a crystalline insulator layer. Gate cavities are formed by removing the disposable gate structures selective to the planarization dielectric layer. Doped semiconductor material portions are removed from underneath the gate cavities to provide pairs of source and drain regions separated by a gate cavity. Within a first gate cavity, a faceted crystalline dielectric material portion is grown from a physically exposed surface of the crystalline insulator layer, while a second gate is temporarily coated with an amorphous material layer. A contoured semiconductor region is epitaxially grown on the faceted crystalline dielectric material portion in the first gate cavity, while a planar semiconductor region is epitaxially grown in the second gate cavity. The semiconductor regions can provide at least one contoured channel region and at least one planar channel region.

20 Claims, 15 Drawing Sheets

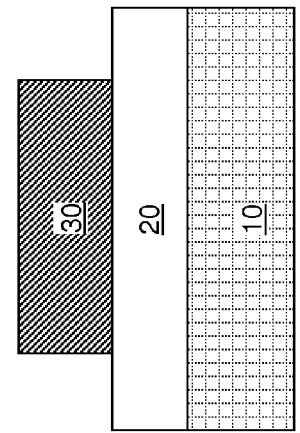
FIG. 2C
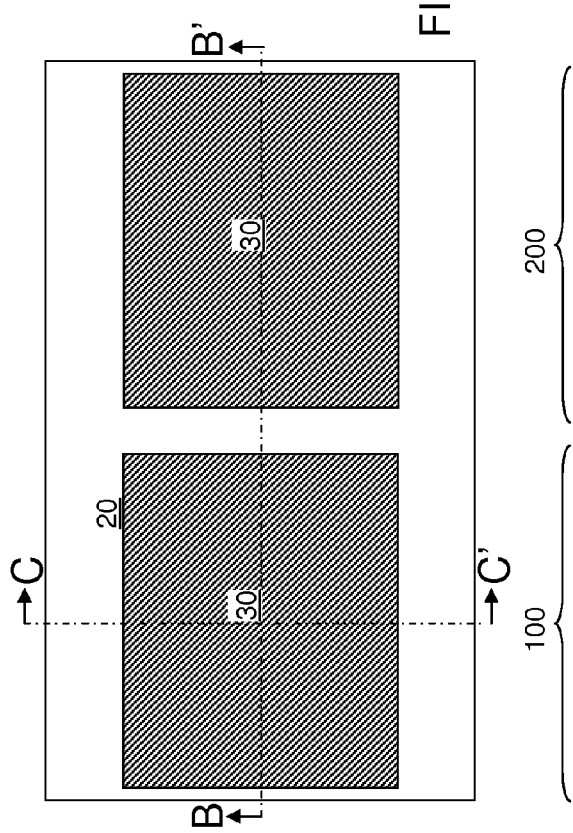
FIG. 2A
FIG. 2B

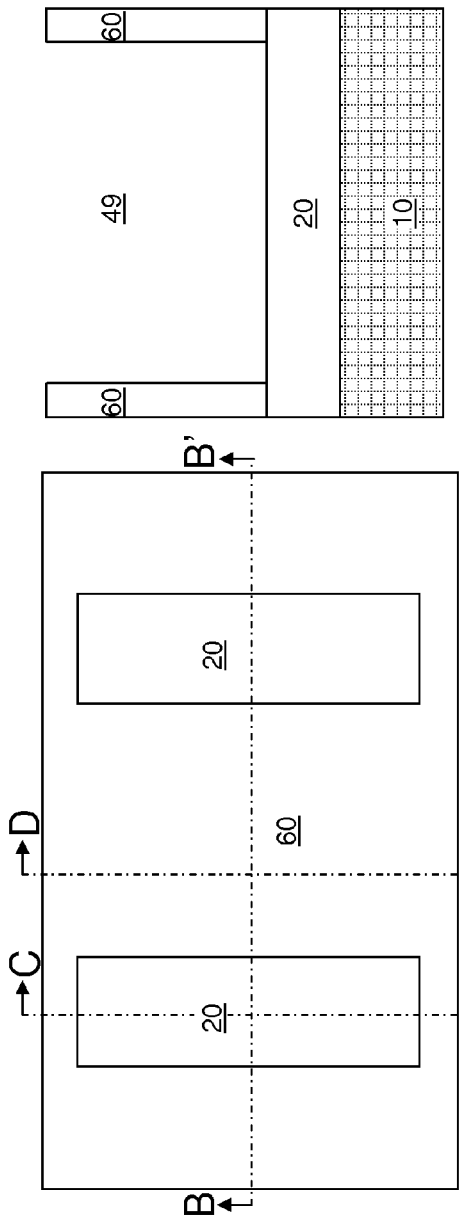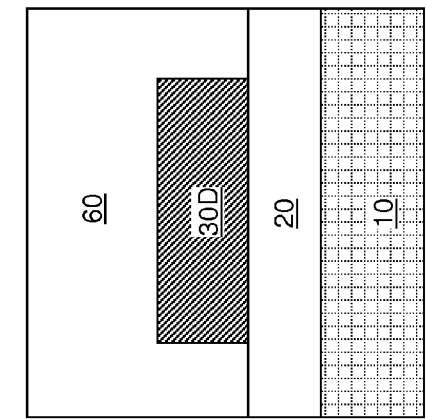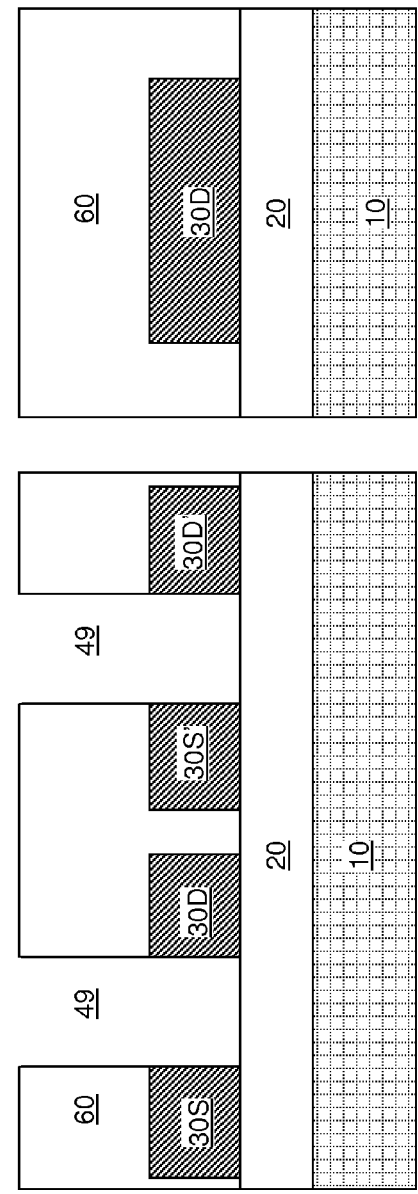

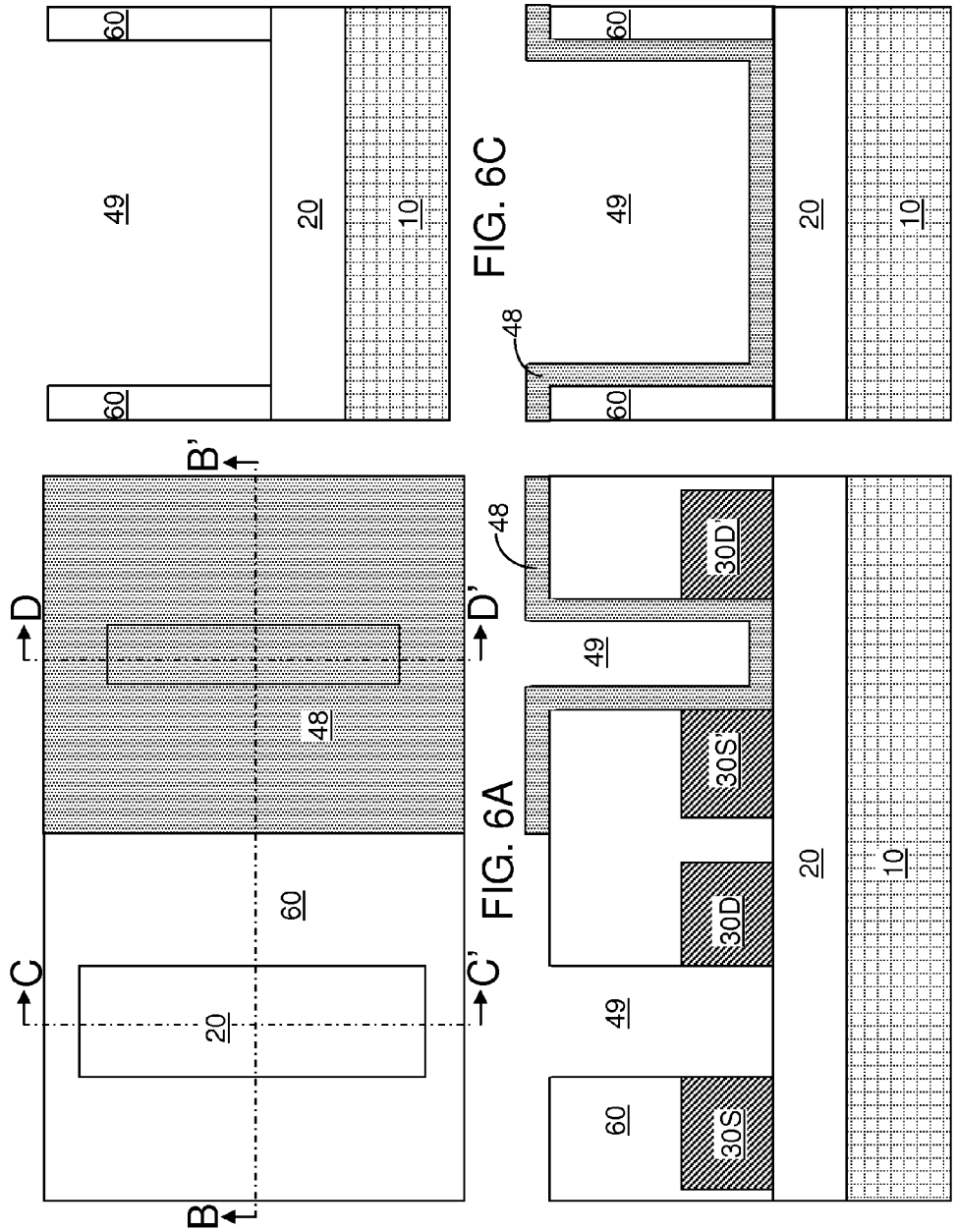

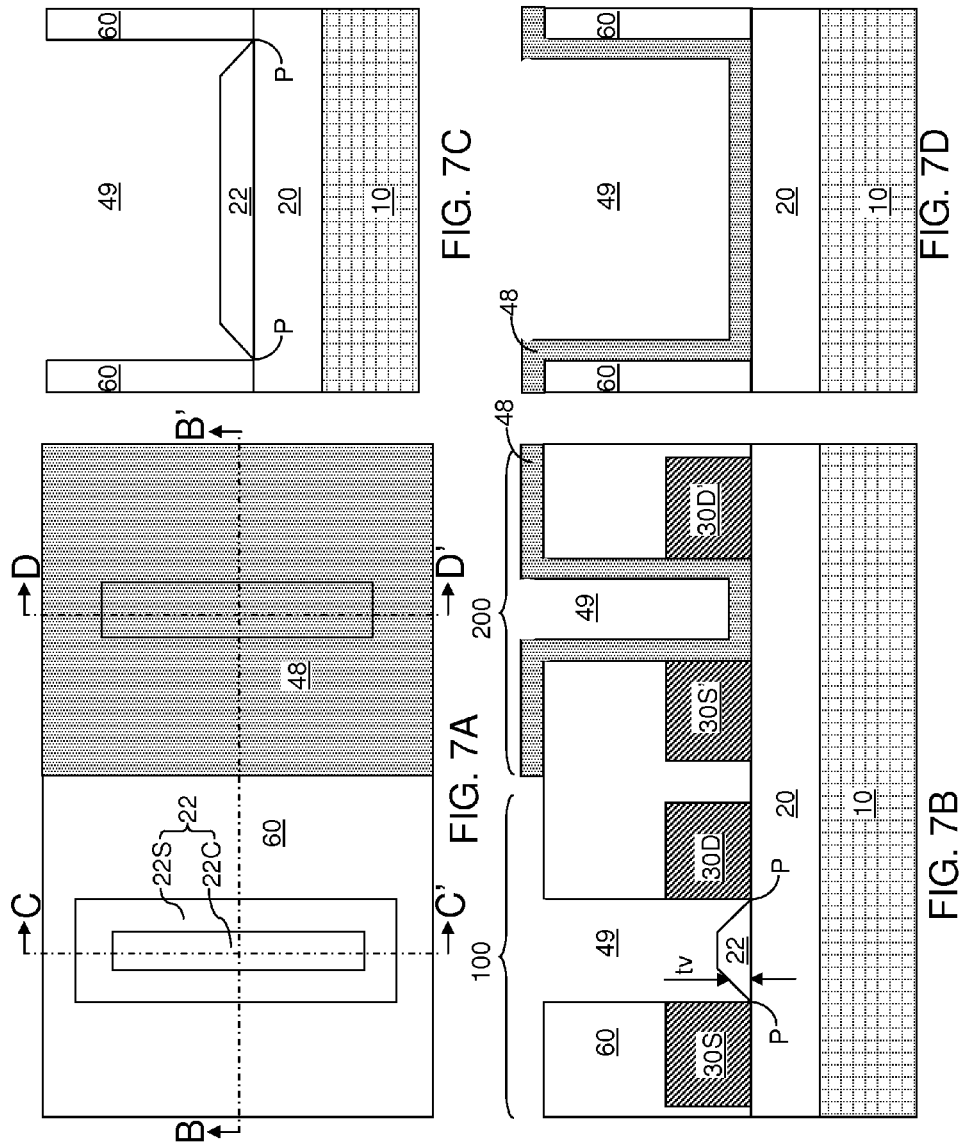

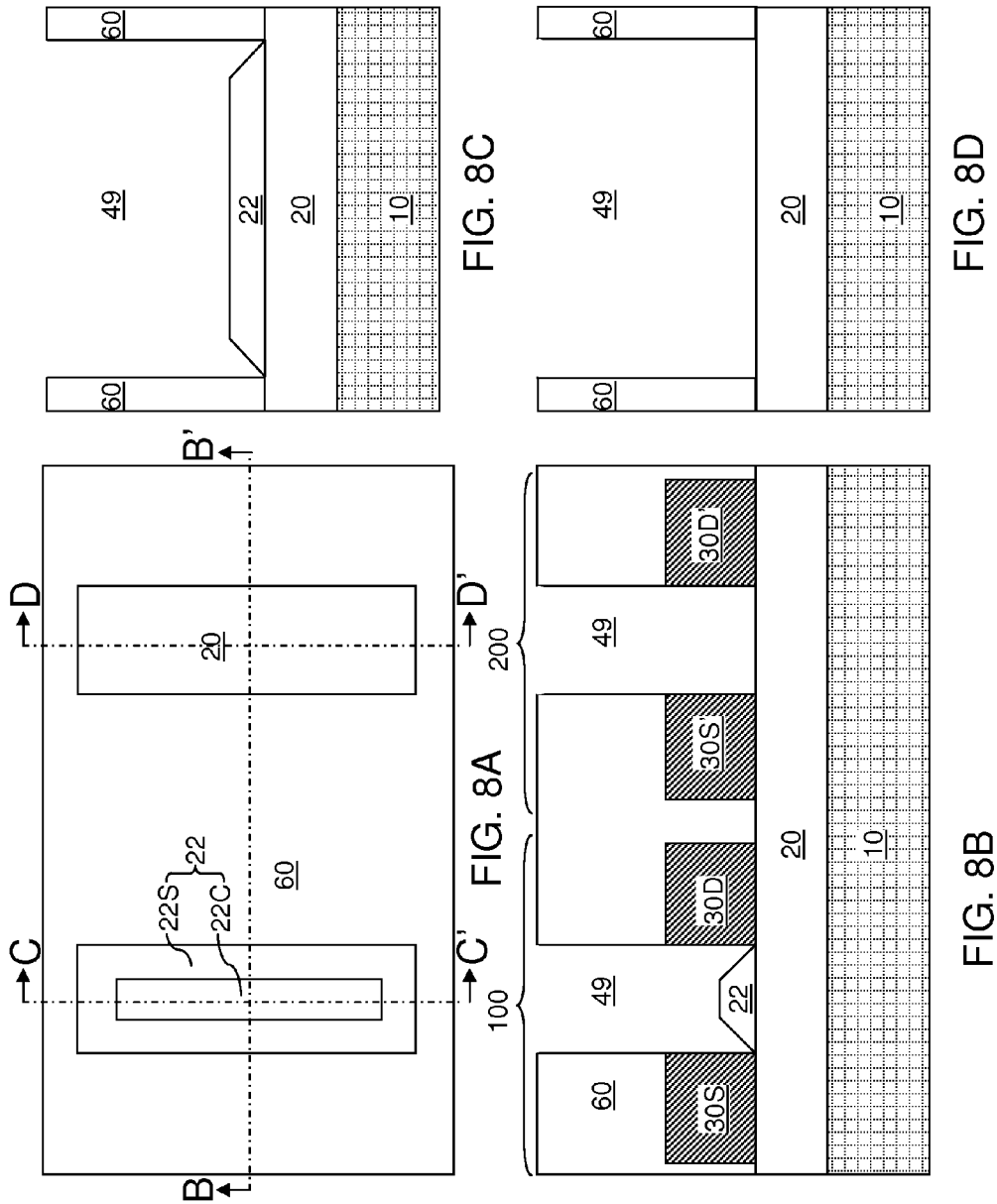

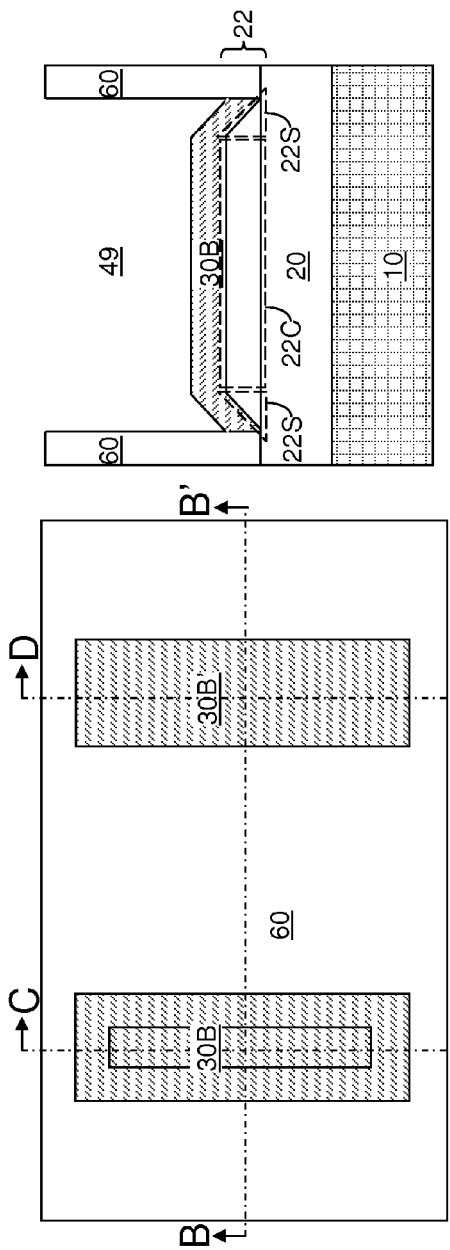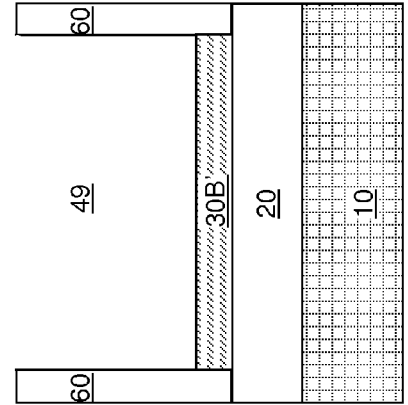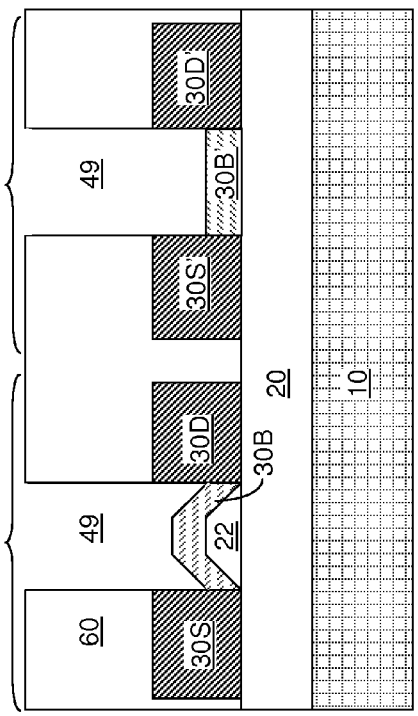

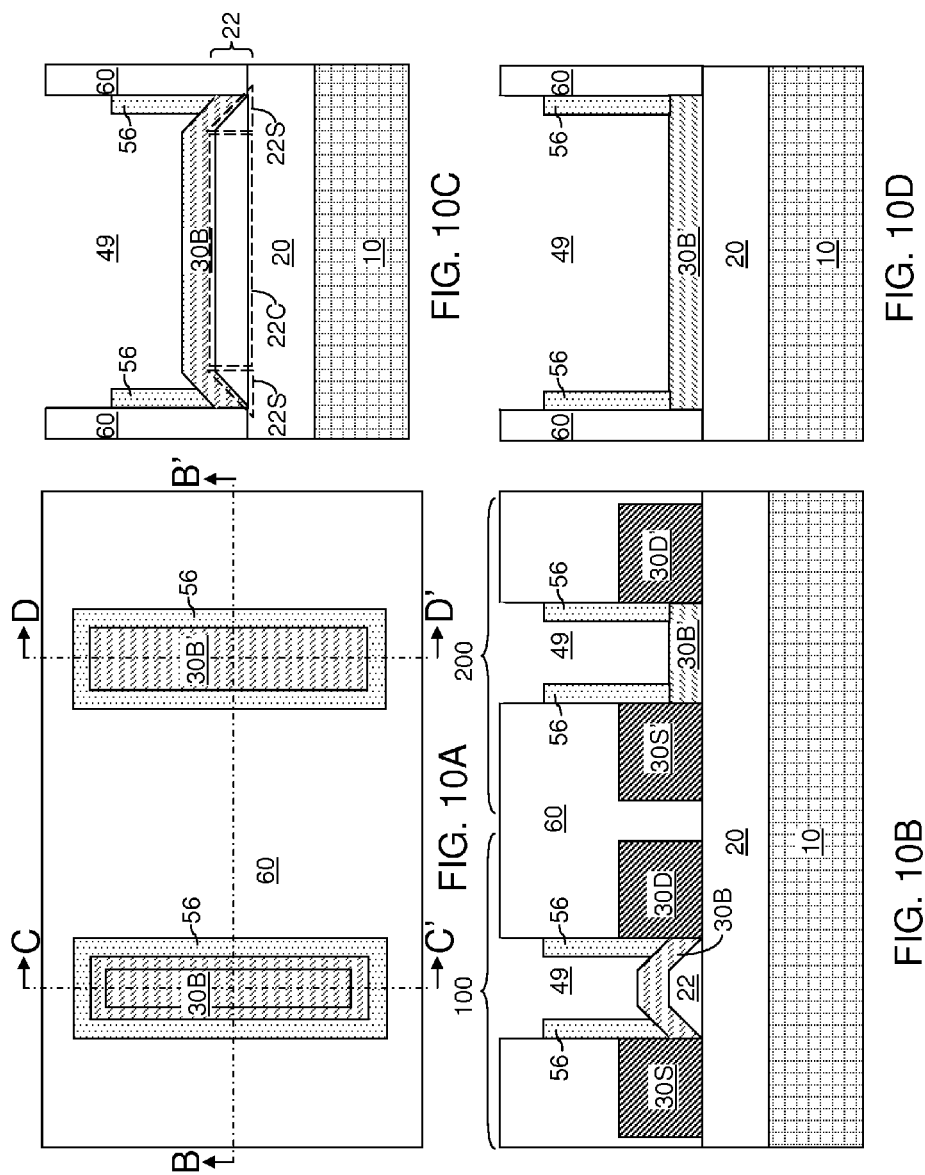

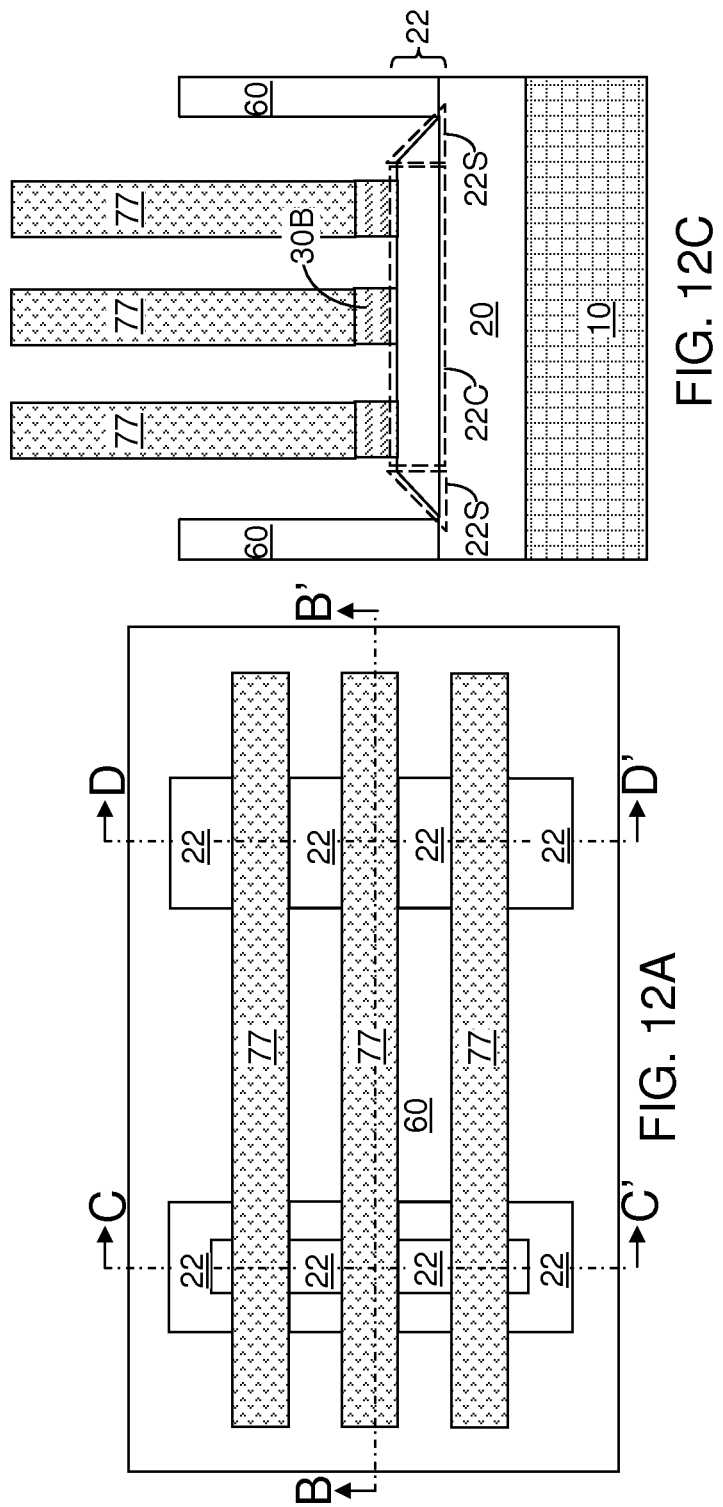

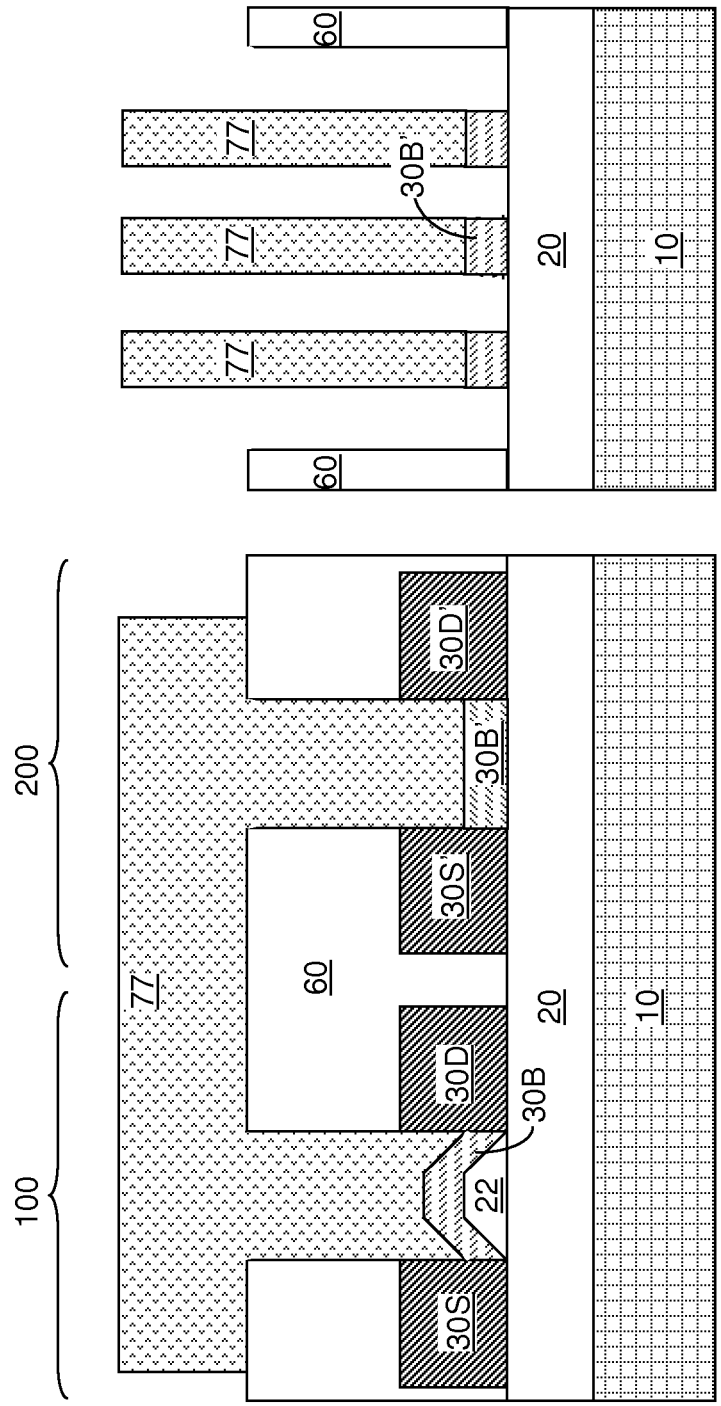

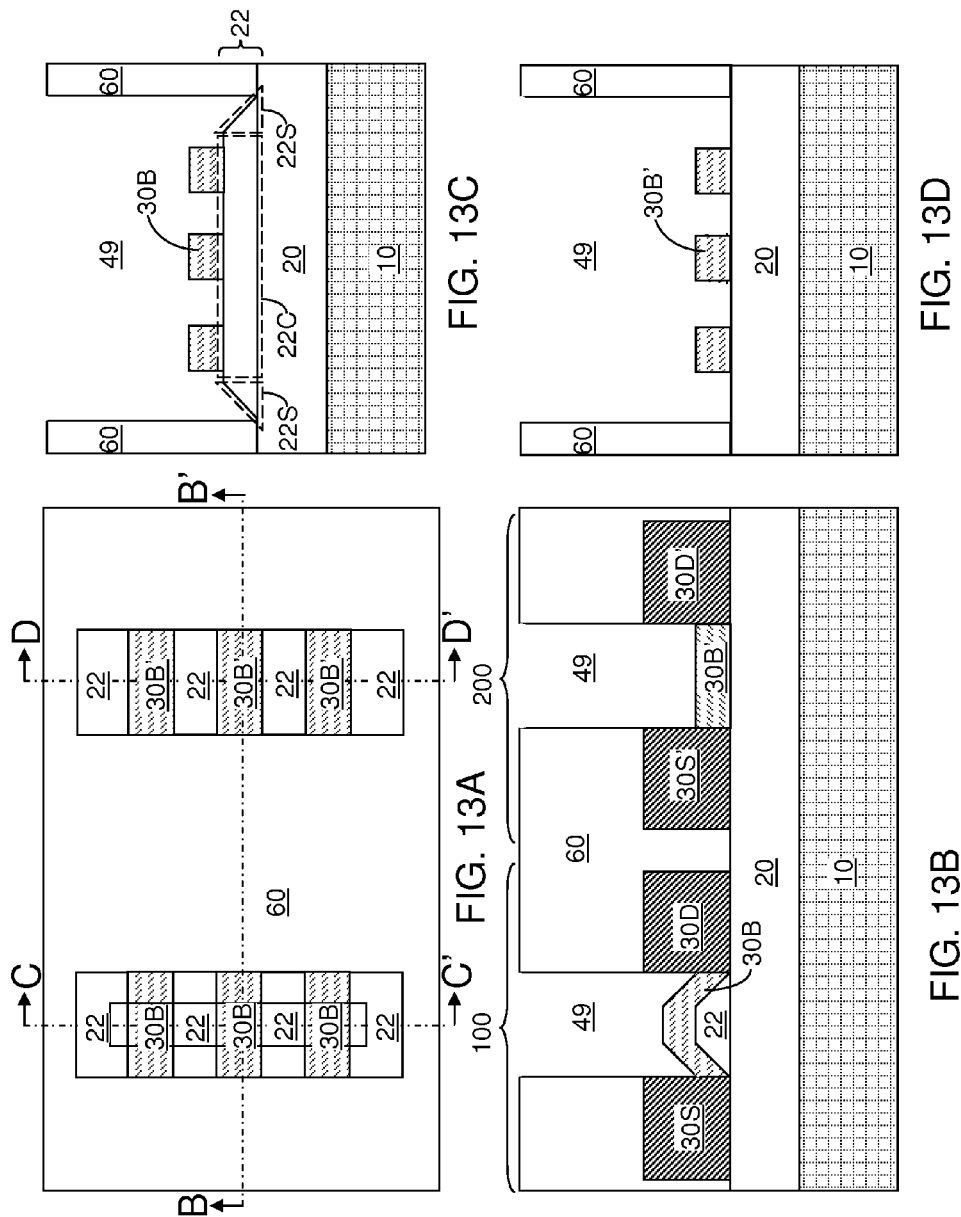

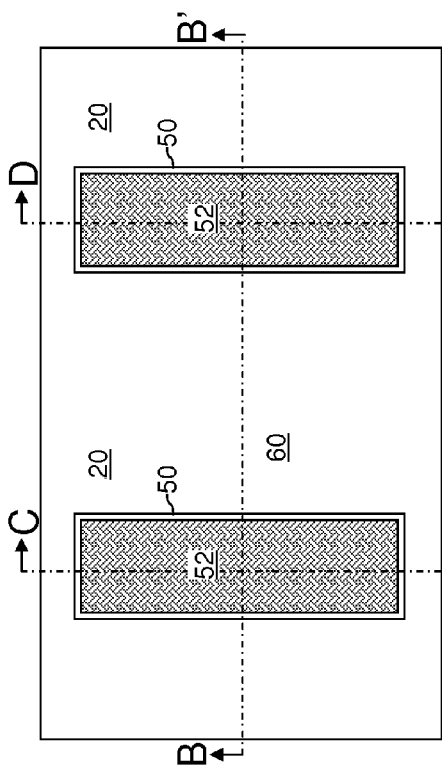
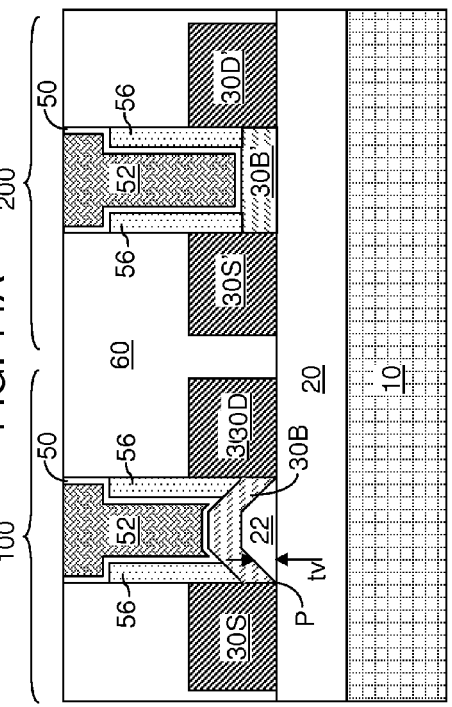
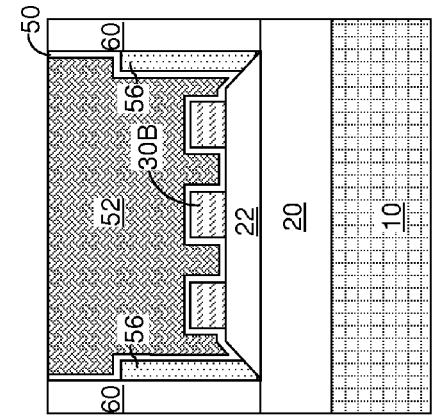
FIG. 14C
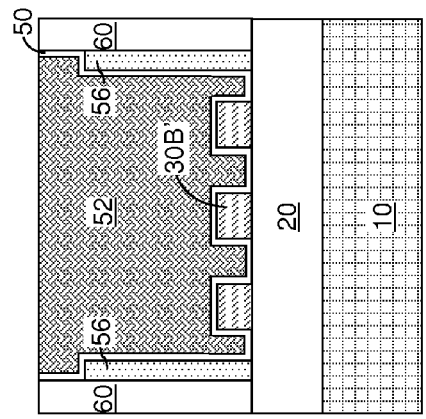
FIG. 14D

FIELD EFFECT TRANSISTORS INCLUDING CONTOURED CHANNELS AND PLANAR CHANNELS

BACKGROUND

The present disclosure relates to a semiconductor structure, and particularly to field effect transistors including at least one contoured channel and at least one planar channel and a method of manufacturing the same.

Extremely thin semiconductor on insulator (ETSOI) devices have drawn attention for their enhanced electrostatic properties. At tight gate pitches and aggressively scaled gate lengths, short channel effects and multiple threshold voltages can be problems for field effect transistors including multiple channels.

SUMMARY

Disposable gate structures and a planarization dielectric layer are formed over doped semiconductor material portions on a crystalline insulator layer. Gate cavities are formed by removing the disposable gate structures selective to the planarization dielectric layer. Doped semiconductor material portions are removed from underneath the gate cavities to provide pairs of source and drain regions separated by a gate cavity. Within a first gate cavity, a faceted crystalline dielectric material portion is grown from a physically exposed surface of the crystalline insulator layer, while a second gate is temporarily coated with an amorphous material layer. After removal of the amorphous material layer, a contoured semiconductor region is epitaxially grown on the faceted crystalline dielectric material portion in the first gate cavity, while a planar semiconductor region is epitaxially grown in the second gate cavity. With or without patterning, the semiconductor regions can provide at least one contoured channel region and at least one planar channel region. Each contoured channel region can increase the distance that charge carriers travel relative to a separation distance between the source region and the drain region, thereby reducing the short channel effect and variations in the threshold voltage.

According to an aspect of the present disclosure, a semiconductor structure is provided. The semiconductor structure includes a faceted dielectric material portion located on an insulator layer and having faceted non-horizontal surfaces, at least one channel region located on the faceted dielectric material portion and including a semiconductor material, and a source region and a drain region located on the insulator layer and laterally contacting the at least one channel region. The faceted dielectric material portion includes sub-portions having a varying thickness that increases with a lateral distance from one of the source region and the drain region.

According to another aspect of the present disclosure, a method of forming a semiconductor structure is provided. A source region and a drain region separated by a cavity therebetween are formed on a top surface of an insulator layer. A faceted dielectric material portion is grown on a portion of the top surface of the insulator layer between the source region and the drain region. The faceted dielectric material portion includes sub-portions having a varying thickness that increases with a lateral distance from one of the source region and the drain region. A contoured semiconductor region including a semiconductor material is grown from a top surface of the faceted dielectric material portion within the cavity. At least one channel region is grown by patterning the semiconductor material region.

BRIEF DESCRIPTION OF SEVERAL VIEWS OF THE DRAWINGS

FIG. 2A is a top-down view of the first exemplary semiconductor structure after formation of semiconductor material portions on a crystalline insulator layer according to the first embodiment of the present disclosure.

FIG. 2B is a vertical cross-sectional view of the first exemplary semiconductor structure along the vertical plane B-B' in FIG. 1A.

FIG. 2C is a vertical cross-sectional view of the first exemplary semiconductor structure along the vertical plane C-C' in FIG. 1A.

FIG. 5A is a top-down view of the first exemplary semiconductor structure after removal of physically exposed portions of the semiconductor material portions from underneath the gate cavities according to the first embodiment of the present disclosure.

FIG. 5B is a vertical cross-sectional view of the first exemplary semiconductor structure along the vertical plane B-B' in FIG. 5A.

FIG. 5C is a vertical cross-sectional view of the first exemplary semiconductor structure along the vertical plane C-C' in FIG. 5A.

FIG. 5D is a vertical cross-sectional view of the first exemplary semiconductor structure along the vertical plane D-D' in FIG. 5A.

FIG. 6A is a top-down view of the first exemplary semiconductor structure after formation of an amorphous material layer according to the first embodiment of the present disclosure.

FIG. 6B is a vertical cross-sectional view of the first exemplary semiconductor structure along the vertical plane B-B' in FIG. 6A.

FIG. 6C is a vertical cross-sectional view of the first exemplary semiconductor structure along the vertical plane C-C' in FIG. 6A.

FIG. 6D is a vertical cross-sectional view of the first exemplary semiconductor structure along the vertical plane D-D' in FIG. 6A.

FIG. 7A is a top-down view of the first exemplary semiconductor structure after formation of a faceted dielectric material portion by selective epitaxy in the first gate cavity according to the first embodiment of the present disclosure.

FIG. 7B is a vertical cross-sectional view of the first exemplary semiconductor structure along the vertical plane B-B' in FIG. 7A.

FIG. 7C is a vertical cross-sectional view of the first exemplary semiconductor structure along the vertical plane C-C' in FIG. 7A.

FIG. 7D is a vertical cross-sectional view of the first exemplary semiconductor structure along the vertical plane D-D' in FIG. 7A.

FIG. 8A is a top-down view of the first exemplary semiconductor structure after removal of the amorphous material layer according to the first embodiment of the present disclosure.

FIG. 8B is a vertical cross-sectional view of the first exemplary semiconductor structure along the vertical plane B-B' in FIG. 8A.

FIG. 8C is a vertical cross-sectional view of the first exemplary semiconductor structure along the vertical plane C-C' in FIG. 8A.

FIG. 8D is a vertical cross-sectional view of the first exemplary semiconductor structure along the vertical plane D-D' in FIG. 8A.

FIG. 9A is a top-down view of the first exemplary semiconductor structure after formation of a contoured semiconductor region and a planar semiconductor region by selective epitaxy according to the first embodiment of the present disclosure.

FIG. 9B is a vertical cross-sectional view of the first exemplary semiconductor structure along the vertical plane B-B' in FIG. 9A.

FIG. 9C is a vertical cross-sectional view of the first exemplary semiconductor structure along the vertical plane C-C' in FIG. 9A.

FIG. 9D is a vertical cross-sectional view of the first exemplary semiconductor structure along the vertical plane D-D' in FIG. 9A.

FIG. 10A is a top-down view of the first exemplary semiconductor structure after formation of a gate spacer according to the first embodiment of the present disclosure.

FIG. 10B is a vertical cross-sectional view of the first exemplary semiconductor structure along the vertical plane B-B' in FIG. 10A.

FIG. 10C is a vertical cross-sectional view of the first exemplary semiconductor structure along the vertical plane C-C' in FIG. 10A.

FIG. 10D is a vertical cross-sectional view of the first exemplary semiconductor structure along the vertical plane D-D' in FIG. 10A.

FIG. 12A is a top-down view of a second exemplary semiconductor structure after patterning of a contoured semiconductor region and a planar semiconductor region from underneath gate cavities according to a second embodiment of the present disclosure.

FIG. 12B is a vertical cross-sectional view of the second exemplary semiconductor structure along the vertical plane B-B' in FIG. 12A.

FIG. 12C is a vertical cross-sectional view of the second exemplary semiconductor structure along the vertical plane C-C' in FIG. 12A.

FIG. 12D is a vertical cross-sectional view of the second exemplary semiconductor structure along the vertical plane D-D' in FIG. 12A.

FIG. 13A is a top-down view of the second exemplary semiconductor structure after removal of a patterned photoresist layer according to the second embodiment of the present disclosure.

FIG. 13B is a vertical cross-sectional view of the second exemplary semiconductor structure along the vertical plane B-B' in FIG. 13A.

FIG. 13C is a vertical cross-sectional view of the second exemplary semiconductor structure along the vertical plane C-C' in FIG. 13A.

FIG. 13D is a vertical cross-sectional view of the second exemplary semiconductor structure along the vertical plane D-D' in FIG. 13A.

FIG. 14A is a top-down view of the second exemplary semiconductor structure after formation of gate dielectrics and gate electrodes according to the second embodiment of the present disclosure.

FIG. 14B is a vertical cross-sectional view of the second exemplary semiconductor structure along the vertical plane B-B' in FIG. 14A.

FIG. 14C is a vertical cross-sectional view of the second exemplary semiconductor structure along the vertical plane C-C' in FIG. 14A.

FIG. 14D is a vertical cross-sectional view of the second exemplary semiconductor structure along the vertical plane D-D' in FIG. 14A.

DETAILED DESCRIPTION

Figure 1A:
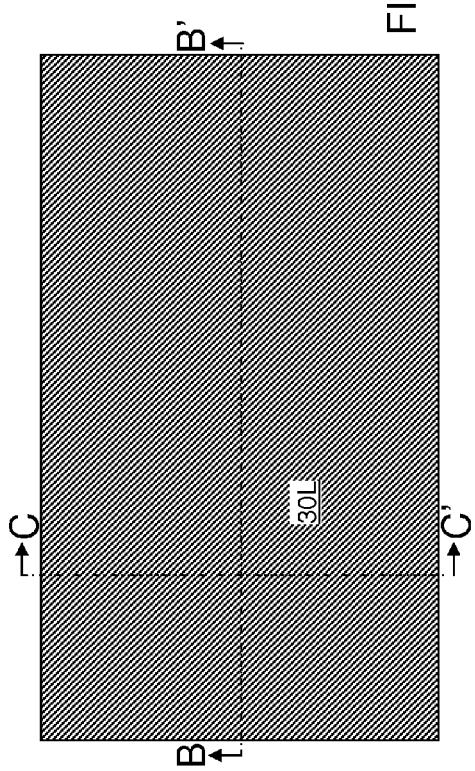
FIG. 1A is a top-down view of a first exemplary semiconductor structure upon providing a stack of a substrate, and insulator layer, and a single crystalline compound semiconductor material layer according to a first embodiment of the present disclosure.

As stated above, the present disclosure relates to field effect transistors including at least one contoured channel and at least one planar channel and a method of manufacturing the same. Aspects of the present disclosure are now described in detail with accompanying figures. It is noted that like reference numerals refer to like elements across different embodiments. The drawings are not necessarily drawn to scale.

Figure 1C:
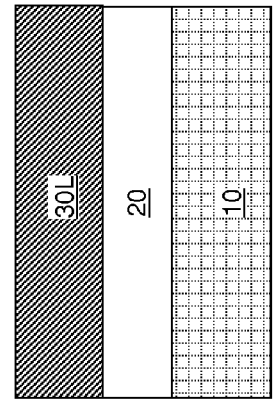
FIG. 1C is a vertical cross-sectional view of the first exemplary semiconductor structure along the vertical plane C-C' in FIG. 1A.
Figure 1B:
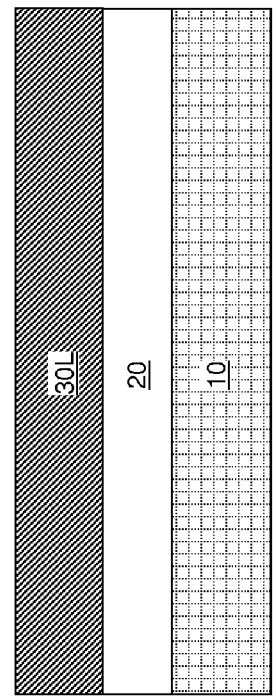
FIG. 1B is a vertical cross-sectional view of the first exemplary semiconductor structure along the vertical plane B-B' in FIG. 1A.

Referring to FIGS. 1A-1C, a first exemplary semiconductor structure according to an embodiment of the present disclosure includes a substrate 10, an insulator layer 20, a single crystalline compound semiconductor material layer 30L. The substrate 10 can be an insulator substrate, a conductive substrate, or a semiconducting substrate. In one embodiment, the substrate 10 can be a semiconductor substrate including silicon, germanium, a silicon-germanium alloy, a graded III-V compound semiconductor material, or combinations thereof. In one embodiment, the substrate 10 can include a single crystalline material on which the insulator layer 20 can be formed as a single crystalline material, for example, by epitaxial deposition. In one embodiment, the substrate 10 can be a single crystalline silicon substrate with a graded III-V compound material layer thereupon, or can be a single crystalline InP substrate.

The insulator layer 20 can be a single crystalline insulator layer including a single crystalline compound insulator material. As used herein, an insulator material refers to a material having a resistivity greater than $1.0 \times 10^3$ Ohm-cm. As used herein, a compound insulator material refers to an insulator material that includes a compound of at least two elements. The compound insulator material can be a III-V compound including a Group III element and a Group V element, or can be a II-V compound including a Group II element and a Group VI element. As used herein, a single crystalline compound insulator material refers to a compound insulator material that is single crystalline, i.e., having an epitaxial alignment among atoms throughout the entirety of the compound insulator material. In one embodiment, the single crystalline compound insulator material of the insulator layer 20 can be gallium arsenide.

In one embodiment, the insulator layer 20 can include a rare-earth oxide material, which is an oxide material of a rare-earth element. Rare earth elements are also referred to as Lanthanides, and include La, Ce, Pr, Nd, Pm, Sm, Eu, Gd, Tb, Dy, Ho, Er, Tm, Yb, and Lu. The ionic radii of rare earth elements decrease gradually with the atomic number, and the total variation of the ionic radii of rare earth elements is less than 15% among one another. The rare earth elements form various single crystalline dielectric oxides with a valance of +3, i.e., a dielectric oxide having a chemical formula of $M_2O_3$, in which M can be any of the rare earth elements.

Crystalline rare earth oxides are lattice coincident on a class of elemental or alloyed single crystalline semiconductor materials including single crystalline silicon, a single crystalline silicon-germanium alloy, a single crystalline silicon-carbon alloy, and a single crystalline silicon-germanium-carbon alloy. For each single crystalline $M_2O_3$ in which M is a rare earth element, at least one single crystalline semiconductor material having a lattice constant that is one half the lattice constant of the single crystalline $M_2O_3$ exists among single crystalline silicon, a single crystalline silicon-germanium alloy, a single crystalline silicon-carbon alloy, and a single crystalline silicon-germanium-carbon alloy.

For example, twice the lattice constant of silicon is between the lattice constant of gadolinium oxide ($Gd_2O_3$) and the lattice constant of neodymium oxide ($Nd_2O_3$). Thus, the composition of a single crystalline alloy of gadolinium oxide and neodymium oxide can be selected to match twice the lattice constant of silicon. In other words, the value x in the compound $Gd_{2-x}Nd_xO_3$ can be selected to provide a single crystalline compound having a lattice constant that is twice the lattice constant of silicon.

In another example, twice the lattice constant of germanium is between the lattice constant of praseodymium oxide ($Pd_2O_3$) and the lattice constant of lanthanum oxide ($La_2O_3$). Thus, the composition of a single crystalline alloy of praseodymium oxide and lanthanum oxide can be selected to match twice the lattice constant of germanium. In other words, the value y in the compound $Pd_{2-y}La_yO_3$ can be selected to provide a single crystalline compound having a lattice constant that is twice the lattice constant of silicon.

In one embodiment, the substrate 10 can include single crystalline silicon, single crystalline germanium, or a single crystalline silicon-germanium alloy, and the insulator layer 20 can be formed with a single crystalline insulator layer with epitaxial alignment to the single crystalline structure of the substrate 10. In one embodiment, the insulator layer 20 can include a single crystalline rare earth oxide selected from $Er_2O_3$, $Gd_2O_3$, $Nd_2O_3$, $Pr_2O_3$, $La_2O_3$, and a single crystalline alloy thereof.

In addition, crystalline rare earth oxides are lattice coincident on various single crystalline semiconductor materials that include III-V compound semiconductor materials and II-VI compound semiconductor materials. Thus, for each single crystalline $M_2O_3$ in which M is a rare earth element, at least one single crystalline compound semiconductor material having a lattice constant that is one half the lattice constant of the single crystalline $M_2O_3$ exists.

By selecting a rare-earth oxide material that is an oxide of a single rare-earth element or an oxide of an alloy of at least two rare-earth elements, the material of the insulator layer 20 can be lattice matched to, and epitaxially aligned to, the underlying single crystalline material within the substrate 10. Method of forming a single crystalline rare-earth oxide material is described, for example, in U.S. Pat. Nos. 7,655,327 and 7,709,826 to Atanackovic.

The single crystalline compound semiconductor material layer 30L includes a single crystalline compound semiconductor material in epitaxial alignment with the single crystalline compound insulator material of the insulator layer 20. As used herein, a semiconducting material refers to a material having a resistivity less than $1.0 \times 10^3$ Ohm-cm and greater than $1.0 \times 10^{-3}$ Ohm-cm. As used herein, a semiconductor material refers to a material that can have a resistivity less than $1.0 \times 10^3$ Ohm-cm and greater than $1.0 \times 10^{-3}$ Ohm-cm upon suitable doping, i.e., can become a semiconducting material upon suitable doping. As used herein, a compound semiconductor material refers to a semiconductor material that includes a compound of at least two elements. The thickness of the single crystalline compound semiconductor material layer 30L can be in a range from 10 nm to 200 nm, although lesser and greater thicknesses can also be employed.

The single crystalline compound semiconductor material of the single crystalline compound semiconductor material layer 30L can be formed by epitaxial deposition with in-situ doping with electrical dopants. The electrical dopants can be p-type dopants or n-type dopants. The conductivity type of the single crystalline compound semiconductor material layer 30L is herein referred to as a first conductivity type. In one embodiment, the dopant concentration of the first conductivity type dopants within the single crystalline compound semiconductor material layer 30L can be in a range from $1.0 \times 10^{19}/cm^3$ to $5.0 \times 10^{21}/cm^3$, although lesser and greater dopant concentrations can also be employed. In one embodiment, the resistivity of the single crystalline compound semiconductor material layer 30L can be greater than $1.0 \times 10^{-5}$ Ohm-cm and less than $1.0 \times 10^{-2}$ Ohm-cm. In another embodiment, the single crystalline compound semiconductor material layer 30L can be conductive, and have a resistivity greater than $3.0 \times 10^{-5}$ Ohm-cm and less than $1.0 \times 10^{-3}$ Ohm-cm. As used herein, a material is conductive if the conductivity of the material is less than $1.0 \times 10^{-3}$ Ohm-cm.

Alternately or additionally, the single crystalline compound semiconductor material of the single crystalline compound semiconductor material layer 30L can be formed by epitaxial deposition and ion implantation of electrical dopants of the first conductivity type. The implanted electrical dopants can be electrically activated by an anneal at an elevated temperature, which can be in a range from 600 degree Celsius to 1,000 degree Celsius.

The single crystalline compound semiconductor material of the single crystalline compound semiconductor material layer 30L is in epitaxial alignment with the single crystalline compound insulator material of the insulator layer 20. In one embodiment, the single crystalline compound semiconductor material layer 30L can be formed by epitaxial deposition of the single crystalline compound semiconductor material upon the insulator layer 20. In one embodiment, metal organic chemical vapor deposition (MOCVD) can be employed to deposit the single crystalline compound semiconductor material layer 30L with epitaxial alignment to the insulator layer 20. In one embodiment, the single crystalline compound semiconductor material can be InGaAs.

Referring to FIGS. 2A-2C, doped semiconductor material portions 30 can be formed on the insulator layer 20 by patterning the single crystalline compound semiconductor material layer 30L. Each doped semiconductor material portion 30 can be single crystalline, and can be epitaxially aligned to a crystallographic structure of the insulator layer 20.

In one embodiment, each doped semiconductor material portion 30 can have a pair of parallel vertical sidewalls. For example, a photoresist layer (not shown) can be applied over the single crystalline compound semiconductor material layer 30L. The photoresist layer is patterned by lithographic exposure and development to cover portions of the single crystalline compound semiconductor material layer 30L. The pattern in the photoresist layer can be selected such that the horizontal cross-sectional shapes of the patterned photoresist layer include parallelograms. In one embodiment, the horizontal cross-sectional shapes of the patterned photoresist layer include rectangular shapes. In one embodiment, the horizontal cross-sectional shapes of the patterned photoresist layer include a plurality of rectangular shapes having a pair of edges that extend along a same horizontal direction.

The pattern in the photoresist layer can be transferred into the single crystalline compound semiconductor material layer 30L by an anisotropic etch to pattern the single crystalline compound semiconductor material layer 30L. In one embodiment, the single crystalline compound semiconductor material layer 30L can be patterned to form a plurality of doped semiconductor material portions 30 including a first semiconductor material portion 30 in a first device region 100 and a second doped semiconductor material portion 30 in a second device region 200. The photoresist layer is subsequently removed, for example, by ashing.

Each doped semiconductor material portion 30 can include the single crystalline compound semiconductor material, and can be epitaxially aligned to the single crystalline compound insulator material of the insulator layer 20. Each doped semiconductor material portion 30 can have a parallel pair of vertical sidewalls.

Figure 3C:
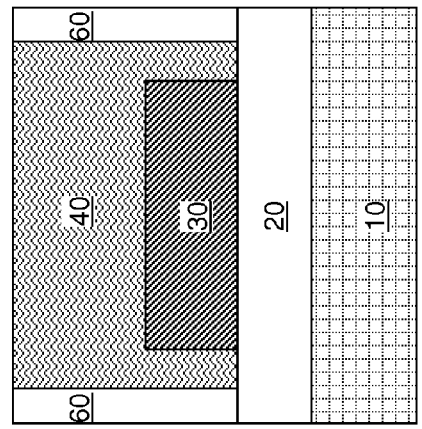
FIG. 3C is a vertical cross-sectional view of the first exemplary semiconductor structure along the vertical plane C-C' in FIG. 3A.
Figure 3A:
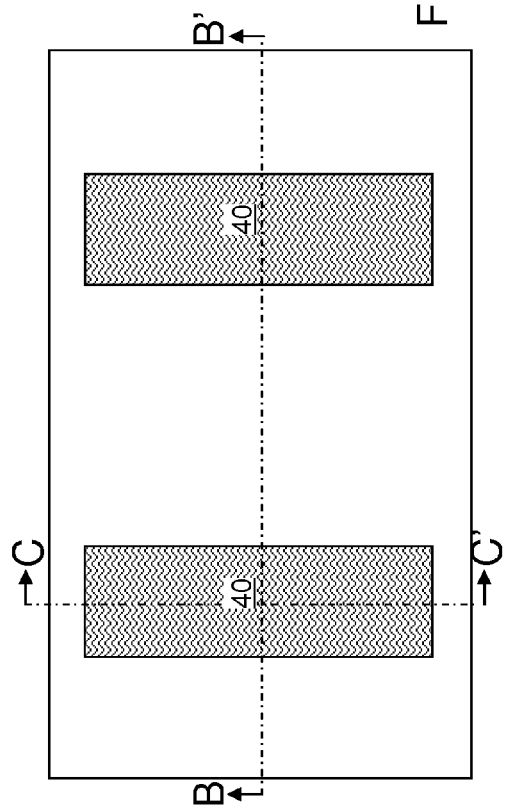
FIG. 3A is a top-down view of the first exemplary semiconductor structure after formation of a disposable gate structure and a planarization dielectric layer according to the first embodiment of the present disclosure.
Figure 3B:
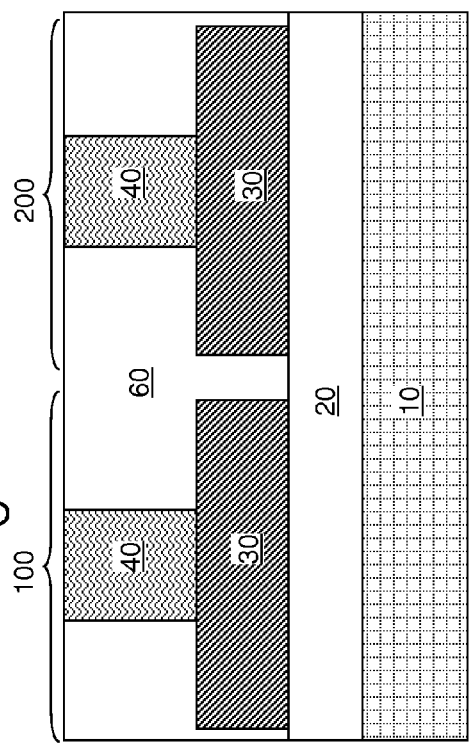
FIG. 3B is a vertical cross-sectional view of the first exemplary semiconductor structure along the vertical plane B-B' in FIG. 3A.

Referring to FIGS. 3A-3C, a disposable gate structure 40 is formed across each doped semiconductor material portion 30. For example, a disposable material layer is deposited over the doped semiconductor material portions 30 and the insulator layer 20, and is patterned to form the disposable gate structures 40. The patterning of the disposable material layer can be performed, for example, by application and patterning of a photoresist layer over the disposable material layer, and transfer of the pattern in the photoresist layer into the disposable material layer by an etch that employs the patterned photoresist layer as an etch mask. Remaining portion of the disposable material layer constitutes the disposable gate structures 40.

The disposable gate structures 40 straddle the doped semiconductor material portions 30. The disposable gate structures 40 include at least one material that can be removed selective to the single crystalline compound semiconductor material of the single crystalline compound semiconductor material layer 30L. For example, the disposable gate structures 40 can include a dielectric material such as organosilicate glass, silicon nitride, amorphous carbon, or a combination thereof. Alternately or additionally, the disposable gate structures 40 can include a semiconductor material that is different from the single crystalline compound semiconductor material of the single crystalline compound semiconductor material layer 30L. For example, the disposable gate structures 40 can include germanium or silicon.

A planarization dielectric layer 60 is deposited conformally over the doped semiconductor material portions 30 and the disposable gate structures 40. The planarization dielectric layer 60 is a dielectric material layer including a dielectric material. For example, a planarizable dielectric material, i.e., a dielectric material that can be planarized, is conformally deposited, and is subsequently planarized. The planarization dielectric layer 60 can be planarized, for example, by chemical mechanical planarization (CMP). The top surface of the disposable gate structures 40 can be employed as a stopping surface during planarization of the planarization dielectric layer 60. The top surface of the planarization dielectric layer 60 can be coplanar with the top surface of the remaining portion of the disposable gate structures 40. The planarization dielectric layer 60 can include a dielectric material such a borosilicate glass (BSG), borophosphosilicate glass (BPSG), fluorosilicate glass (FSG), a porous or non-porous organosilicate glass (OSG), or silicon nitride. The planarization dielectric layer 60 is formed around the disposable gate structures 40, and embeds the disposable gate structures 40 and the doped semiconductor material portions 30.

Figure 4A:
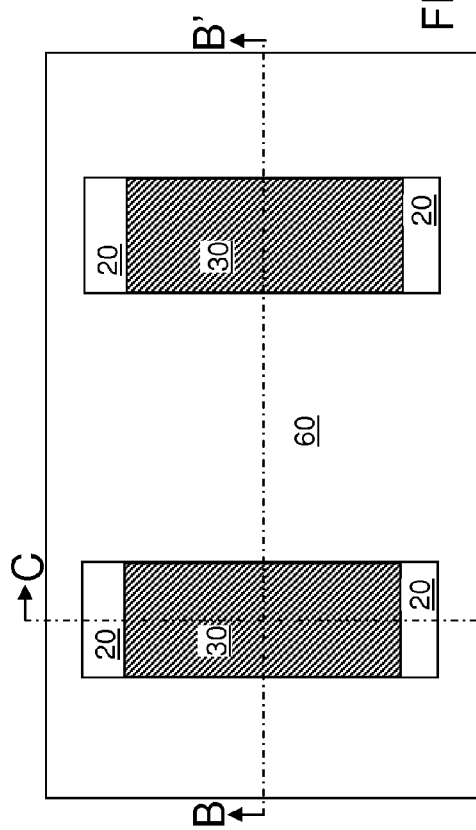
FIG. 4A is a top-down view of the first exemplary semiconductor structure after formation of gate cavities by removal of the disposable gate structure according to the first embodiment of the present disclosure.
Figure 4C:
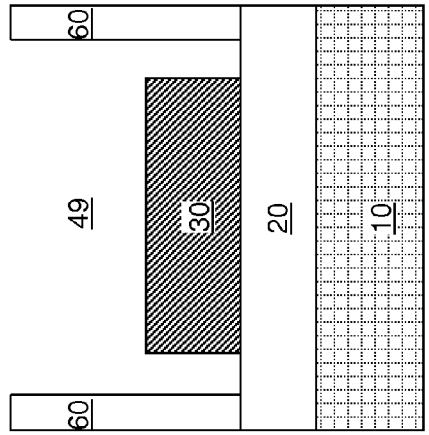
FIG. 4C is a vertical cross-sectional view of the first exemplary semiconductor structure along the vertical plane C-C' in FIG. 4A.
Figure 4B:
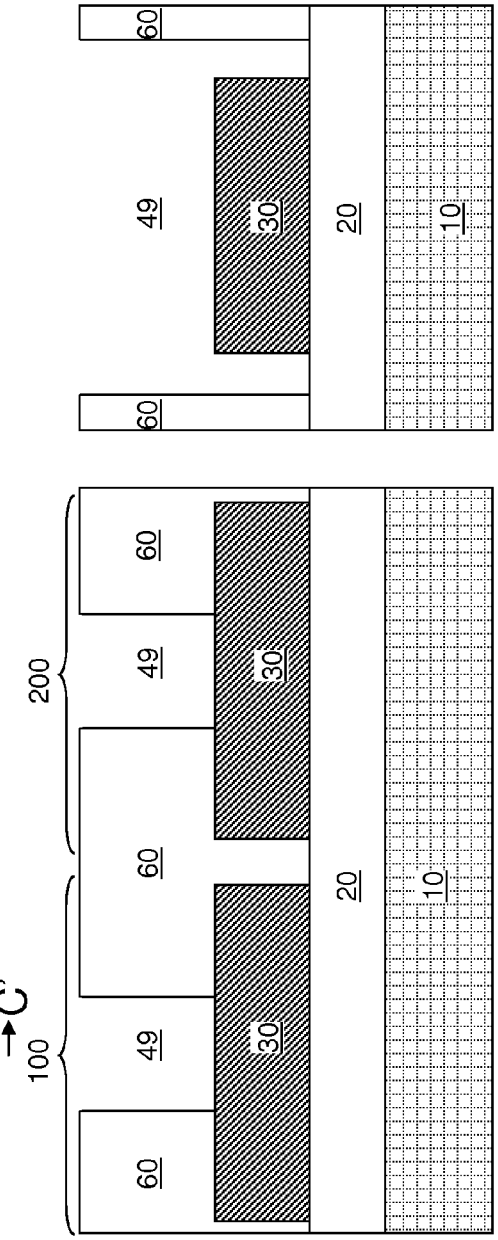
FIG. 4B is a vertical cross-sectional view of the first exemplary semiconductor structure along the vertical plane B-B' in FIG. 4A.
Figure 11C:
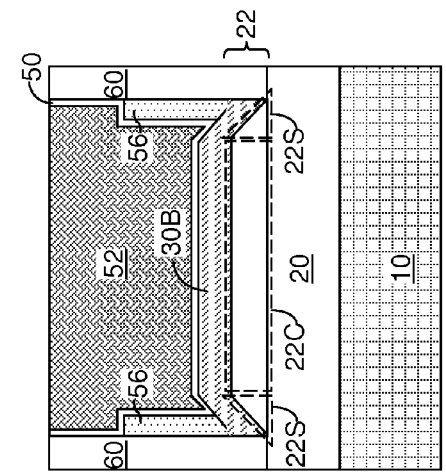
FIG. 11C is a vertical cross-sectional view of the first exemplary semiconductor structure along the vertical plane C-C' in FIG. 11A.
Figure 11D:
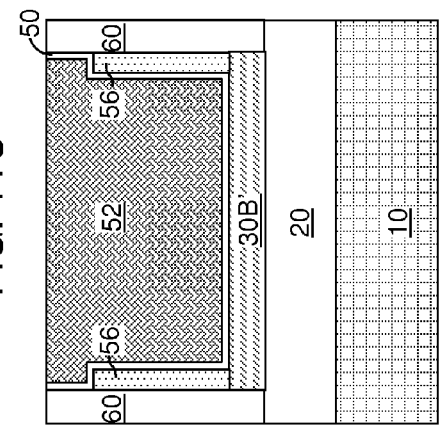
FIG. 11D is a vertical cross-sectional view of the first exemplary semiconductor structure along the vertical plane D-D' in FIG. 11A.
Figure 11A:
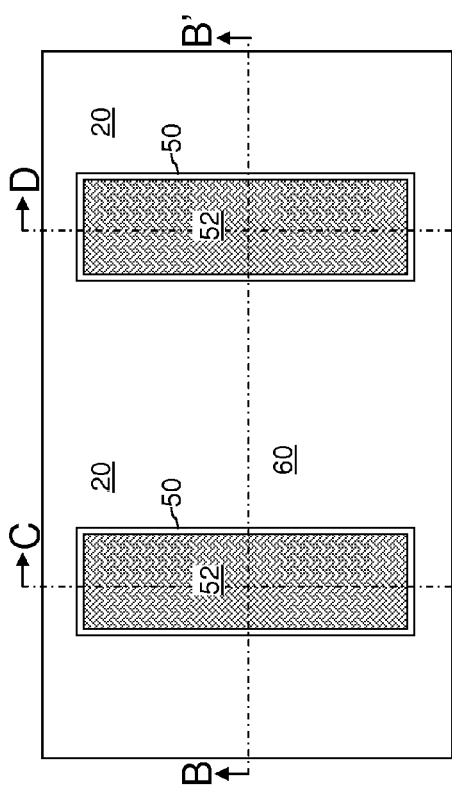
FIG. 11A is a top-down view of the first exemplary semiconductor structure after formation of gate dielectrics and gate electrodes according to the first embodiment of the present disclosure.
Figure 11B:
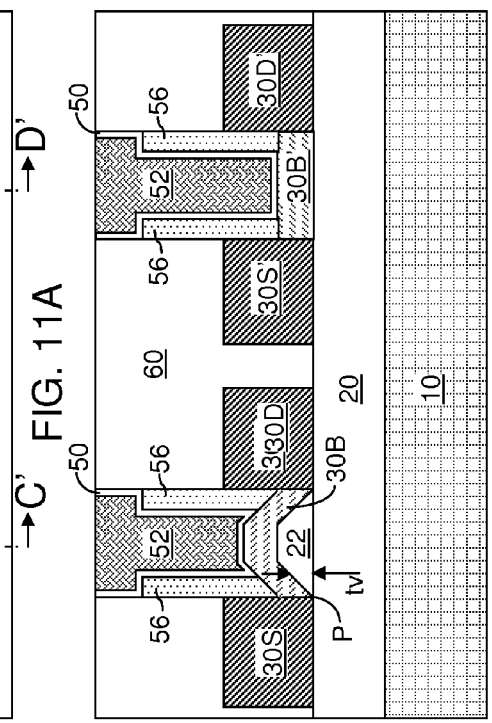
FIG. 11B is a vertical cross-sectional view of the first exemplary semiconductor structure along the vertical plane B-B' in FIG. 11A.

Referring to FIGS. 4A-4C, the disposable gate structures 40 are removed selective to the materials of the planarization dielectric layer 60 and the doped semiconductor material portions 30 by an etch, which can be a wet etch or a dry etch. A gate cavity 49 is formed in each volume from which a disposable gate structure 40 is removed. The surfaces of the planarization dielectric layer 60 are amorphous surfaces.

Referring to FIGS. 5A-5D, physically exposed sub-portions of the doped semiconductor material portions 30 are removed from underneath each gate cavity 49 by an anisotropic etch that employs the planarization dielectric layer 60 as an etch mask. As used herein, a sub-portion is a subset of a portion. Each gate cavity 49 is extended to include the volumes of the removed portions of the doped semiconductor material portions 30. The anisotropic etch can be selective to the material of the insulator layer 20. A gate cavity 49 is formed in each volume from which a disposable gate structure 40 and an underlying sub-portion of the doped semiconductor material portion 30 are removed.

Each remaining sub-portions of a doped semiconductor material portion 30 are separated into a source region (30S, 30S') and a drain region (30D, 30D') by etching each physically exposed sub-portion of the doped semiconductor material portions 30 from underneath the gate cavities 49. The source regions (30S, 30S') include a first source region 30S located in a first device region 100 and a second source region 30S' located in a second device region 200. The drain region (30D, 30D') include a first drain region 30S located in a first device region 10 and a second drain region 30D' located in a second device region 200. After formation of the source regions (30S, 30S') and the drain regions (30D, 30D'), all sidewalls of the gate cavities 49 can be vertical, and can extend from the top surface of the insulator layer 20 to a top surface of the planarization dielectric layer 60. A sidewall of each source region (30S, 30S') can be vertically coincident with a sidewall of the planarization dielectric layer 60. As used herein, a first surface is vertically coincident with a second surface if there exists a vertical plane that includes the first surface and the second surface. A sidewall of each drain region (30D, 30D') can be vertically coincident with a sidewall of the planarization dielectric layer 60. Each pair of a source region (30S, 30S') and a drain region (30D, 30D') is separated by a gate cavity 49, and is located on a top surface of the insulator layer 20.

Referring to FIGS. 6A-6D, an amorphous material layer 48 can be deposited on the bottom surfaces and sidewalls of the gate cavities 49 and the top surface of the planarization dielectric layer. The amorphous material layer 48 can include an amorphous dielectric material, an amorphous conductive material, or an amorphous semiconductor material. For example, the amorphous material layer 48 can include silicon oxide, silicon nitride, silicon oxynitride, an organosilicate glass, a dielectric metal oxide, a conductive metal nitride, a conductive metal carbide, an amorphous Group IV semiconductor material or an alloy thereof, or an amorphous compound semiconductor material. The amorphous material layer 49 can be deposited by a conformal or non-conformal deposition method. For example, the amorphous material layer 49 can be deposited by chemical vapor deposition, sputtering, spin coating, or any other deposition method known to deposit an amorphous material. For example, the amorphous material layer 48 can include silicon oxide or silicon nitride that is deposited by chemical vapor deposition. The amorphous material layer 48 includes a different material than the planarization dielectric layer 60, the semiconductor materials of the source regions (3S, 3S') and the drain regions (3D, 3D'), or the material of the insulator layer 20.

Subsequently, a portion of the amorphous material layer 48 can be removed from above a first portion of the top surface of the insulator layer 20 that underlies the gate cavity 49 in the first device region 100, while another portion of the amorphous material layer 48 is not removed from above a second portion of the top surface of the insulator layer 20 that underlies the gate cavity 49 in the second device region 200.

In one embodiment, the amorphous material layer 48 can be deposited in the first and second device regions (100, 200) by a conformal deposition method or a non-conformal deposition method. A photoresist layer (not shown) can be applied over the amorphous material layer 48 and is lithographically patterned to cover the portion of the amorphous material layer 48 in the second device region 200, while the photoresist layer is removed from the first device region 100. The portion of the amorphous material layer 48 in the first device region 100 can be removed by an etch process that employs the photoresist layer as an etch mask and is selective to the materials of the planarization dielectric layer 60, the first source region 3S, the first drain region 3D, and the insulator layer 20. The photoresist layer can be subsequently removed, for example, by ashing.

Referring to FIGS. 7A-7D, a faceted dielectric material portion 22 can be formed by selective epitaxy of a dielectric material on the physically exposed surfaces of the insulator layer 20 within the gate cavity 49. The faceted dielectric material portion 22 includes a single crystalline dielectric material that grows from the top surface of the insulator layer 20, and includes crystallographic facets at the surfaces thereof. In one embodiment, all top surfaces of the faceted dielectric material portion 22 can be crystallographic facets. The single crystalline dielectric material of the faceted dielectric material portion 22 can be epitaxially aligned to the crystallographic structure of the single crystalline insulator material of the insulator layer 20.

The faceted dielectric material portion 22 includes angled facets along a periphery of the gate cavity 49, and may optionally include a region having a uniform thickness at a center portion, i.e., a region in which the facet is parallel to the top surface of the insulator layer 20. The portions of the faceted dielectric material portion 22 that include angled facets are herein referred to as peripheral sub-portions 22S of the faceted dielectric material portion 22, and the region having a uniform thickness is herein referred to as a uniform-thickness sub-portion 22C. The peripheral sub-portions 22S of the faceted dielectric material portion 22 have a varying thickness vt that increases with a lateral distance from a periphery P of the faceted dielectric material portion 22. As used herein, a "varying thickness" of an element refers to a thickness that is not constant upon lateral translation within the element. The peripheral sub-portions 22S of the faceted dielectric material portion 22 adjoin the first source region 30S or the first drain region 30D, and can be ring-shaped and laterally surround the uniform-thickness sub-portion 22C. Thus, the faceted dielectric material portion 22 is grown on a portion of the top surface of the insulator layer 20 between the first source region 30S and the first drain region 30D. The faceted dielectric material portion 33 includes sub-portions having a varying thickness that increases with a lateral distance from one of the first source region 30S and the first drain region 30D.

In one embodiment, the faceted dielectric material portion 22 can include a single crystalline rare-earth oxide material. The rare-earth oxide material of the faceted dielectric material portion 22 can be the same as, or can be different from, the dielectric material of the insulator layer 20. In one embodiment, the faceted dielectric material portion 22 and the dielectric layer 20 can include rare-earth oxide materials. The faceted dielectric material portion 22 and the dielectric layer 20 may include the same rare-earth oxide material, or may include different rare-earth oxide materials.

In one embodiment, the selective epitaxy process can provide growth of the single crystalline dielectric material from the top surface of the insulator layer 20 while suppressing growth of the single crystalline dielectric material from surfaces of the first source region 30S and the first drain region 30D or any amorphous surfaces. For example, the orientations of the doped semiconductor material portions 30 (See FIGS. 2A-2C) can be selected such that the physically exposed sidewall surfaces of the first source region 30S and the first drain region 30D within the gate cavity 49 in the first device region 100 can be {110} surface orientations, and the surface orientation of the physically exposed top surface of the insulator layer 20 within the gate cavity can have a (001) surface orientation. In this case, the deposition rate of a single crystalline compound dielectric material can be greater on the top surface of the insulator layer 20 having the (001) surface orientation than on the sidewall surfaces having {110} surface orientations. The ratio of the reactant flow to the etchant flow during the selective epitaxy process, deposition of the single crystalline dielectric material of the faceted dielectric material portion 22 can proceed only vertically from the top surface of the insulator layer 20, and growth of a dielectric material from the sidewalls of the first source region 30S and the first drain region 30D can be suppressed.

During the growth of the faceted dielectric material portion 22, the amorphous material layer 48 is present on the surfaces of the insulator layer 20 and the planarization dielectric layer within the second device region 200. The crystalline insulator material that forms the faceted dielectric material portion 22 is deposited only on crystalline surfaces, and thus, is not deposited on the surfaces of the amorphous material layer 48.

The thickness of the uniform-thickness sub-portion 22C of the faceted dielectric material portion 22 is less than the height of the first source region 30S and the first drain region 30D. Upon termination of growth of the faceted dielectric material portion 22, a top surface of the faceted dielectric material portion 22 is more proximal to the top surface of the insulator layer 20 than top surfaces of the first source region 30S and the first drain region 30D are to the top surface of the insulator layer 20. The thickness of the uniform-thickness sub-portion 22C of the faceted dielectric material portion 22 can be in a range from 3 nm to 100 nm, although lesser and greater thicknesses can also be employed. The thickness of the uniform-thickness sub-portion 22C of the faceted dielectric material portion 22 can be optimized for device performance. The width of the faceted dielectric material portion 22, as measured along the direction perpendicular to the direction connecting the center of mass of the first source region 30S and the center of the first drain region 30D, can be greater than the width of the first source region 30S, or the width of the first drain region 30D.

Selective deposition of a single crystalline rare-earth oxide material can be effected, for example, by modifying the deposition method of U.S. Pat. Nos. 7,655,327 and 7,709,826 to Atanackovic to provide an etchant gas, such as HCl, $NF_3$, $CF_4$, $CHF_3$, or combinations thereof into a process chamber concurrently, or alternately, with reactant gas(es) that is/are precursors for the deposited rare-earth oxide material. During the selective deposition, the single crystalline rare-earth oxide material is deposited, and grows from, only on the single crystalline semiconductor surface of the substrate 10, and does not nucleate, or grow from, the surfaces of the dielectric layer 20. In one embodiment, the faceted dielectric material portion 22 can include a single crystalline rare earth oxide material selected from single crystalline $Er_2O_3$, single crystalline $Gd_2O_3$, single crystalline $Nd_2O_3$, single crystalline $Pr_2O_3$, single crystalline $La_2O_3$, and a single crystalline alloy thereof.

Referring to FIGS. 8A-8D, the amorphous material layer 48 is removed selective to the faceted dielectric material portion 22, the source regions (30S, 30S'), the drain regions (30D, 30D'), and the planarization dielectric layer 60. An isotropic etch can be employed to remove the amorphous material layer 48.

Referring to FIGS. 9A-9D, a contoured semiconductor region 30B and a planar semiconductor region 30B' can be simultaneously formed by selective epitaxy of a semiconductor material directly on the physically exposed surfaces of the faceted dielectric material portion 22 within the gate cavity 49 in the first device region 100, and directly on the physically exposed surfaces of the insulator layer 20 within the gate cavity 49 in the second device region 200. As used herein, a contoured semiconductor region refers to a region including a semiconductor material and having a vertical cross-sectional shape that is not a parallelogram. As used herein, a contoured channel region refers a contoured semiconductor region that is a channel region of a field effect transistor. As used herein, a planar semiconductor region refers to a region including a semiconductor material and having a uniform thickness throughout between a horizontal top surface and a horizontal bottom surface. As used herein, a planar channel region refers a planar semiconductor region that is a channel region of a field effect transistor.

The contoured semiconductor region 30B and the planar semiconductor region 30B' can be grown concurrently in the same selective deposition process. During the selective epitaxy process, the contoured semiconductor region 30B can be grown from the top surfaces of the faceted dielectric material portion 22 within the gate cavity 49 in the first device region 100 and the planar semiconductor region 30B' can be grown from the top surface of the insulator layer 20 within the gate cavity in the second device region 200. The contoured semiconductor region 30B includes a single crystalline semiconductor material that grows from the top surface of the faceted dielectric material portion 22, and the planar semiconductor region 30B' includes a single crystalline semiconductor material that grows from the top surface of the insulator layer 20.

The single crystalline semiconductor material of the contoured semiconductor region 30B can be epitaxially aligned to the crystallographic structure of the single crystalline insulator material of the insulator layer 20. The single crystalline semiconductor material of the planar semiconductor region 30B' can also be epitaxially aligned to the crystallographic structure of the single crystalline insulator material of the insulator layer 20. In one embodiment, the contoured semiconductor region 30B has a uniform thickness over the entirety the uniform-thickness sub-portion 20C (See FIG. 7A). The contoured semiconductor region 30B or patterned portions thereof can function as a channel of a field effect transistor to be formed in the first device region 100. The planar semiconductor region 30B' or patterned portions thereof can function as a channel of a field effect transistor to be formed in the second device region 200. In one embodiment, the contoured semiconductor region 30B and the planar semiconductor region 30B' can include a single crystalline compound semiconductor material, which can be the same as, or different from, the compound semiconductor material of the source regions (30S, 30S') and the drain regions (30D, 30D'). In one embodiment, the contoured semiconductor region 30B, the source regions (30S, 30S'), and the drain regions (30D, 30D') can include InGaAs.

In one embodiment, top surfaces of the faceted dielectric material portion 22 can be crystallographic facets, and the top surfaces and the bottom surfaces of the contoured semiconductor region 30B can be crystallographic surfaces. The single crystalline structure of the contoured semiconductor region 30B can be epitaxially aligned to the single crystalline structure of the faceted dielectric material portion 22.

In one embodiment, the source regions (30S, 30S') and the drain regions (30D, 30D') includes a single crystalline compound semiconductor material having a doping of the first conductivity type, and the contoured channel region has a doping of a second conductivity type that is the opposite of the first conductivity type. In one embodiment, the first conductivity type is p-type and the second conductivity type is n-type. In another embodiment, the first conductivity type is n-type and the second conductivity type is p-type.

In one embodiment, the selective epitaxy process can provide growth of the single crystalline semiconductor material from the top surface of the faceted dielectric material portion 22 while suppressing growth of the single crystalline semiconductor material from surfaces of the source regions (30S, 30S') and the drain regions (30D, 30D'). For example, the orientations of the doped semiconductor material portions 30 (See FIGS. 2A-2C) can be selected such that the physically exposed sidewall surfaces of the source regions (30S, 30S') and the drain regions (30D, 30D') within the gate cavities 49 can be {110} surface orientations, and the surface orientation of the uniform-thickness sub-portion 22C of the faceted dielectric material portion 22 within the gate cavity in the first device region 100 and the surface orientation of the planar semiconductor region 30B' in the second device region 200 can have (001) surface orientations. In this case, the deposition rate of a single crystalline compound semiconductor material can be greater on the top surface of the uniform-thickness sub-portion 22C and the top surface of the planar semiconductor region 30B' (which have (001) surface orientations) than on the sidewall surfaces having {110} surface orientations. The ratio of the reactant flow to the etchant flow during the selective epitaxy process, deposition of the single crystalline compound semiconductor material of the contoured semiconductor region 30B and the planar semiconductor region 30B' can proceed only vertically from the top surface of the faceted dielectric material portion 22 and from the physically exposed top surface of the insulator layer 20 in the cavity 49 in the second device region 200, and growth of a compound semiconductor material from the sidewalls of the source regions (30S, 30S') and the drain regions (30D, 30D') can be suppressed. The deposition rate of the single crystalline compound semiconductor material on the faceted surfaces of the peripheral sub-portions 22S is non-zero during the selective epitaxy process such that the contoured semiconductor region 30B contiguously extends from the source regions (30S, 30S') to the drain regions (30D, 30D').

Upon termination of growth of the contoured semiconductor region 30B and the planar semiconductor region 30B', the top surface of the planar portion of the contoured semiconductor region 30B and the top surface of the planar semiconductor region 30B' can be more proximal to the top surface of the insulator layer 20 than top surfaces of the source regions (30S, 30S') and the drain regions (30D, 30D') are to the top surfaces of the insulator layer 20. The thickness of the planar portion of the contoured semiconductor region 30B and the planar semiconductor region 30B' can be in a range from 3 nm to 100 nm, although lesser and greater thicknesses can also be employed. The thickness of the planar portion of the contoured semiconductor region 30B and the planar semiconductor region 30B' can be optimized for device performance.

Referring to FIGS. 10A-10D, a gate spacer 56 can be formed within each gate cavities 49 by conformally depositing a dielectric material layer over the contoured semiconductor region 30B, and by anisotropically etching the dielectric material layer selective to the semiconductor material of the contoured semiconductor region 30B and the planar semiconductor region 30B' and selective to the dielectric material of the planarization dielectric layer 60. The gate spacer 56 includes a dielectric material that is different from the dielectric material of the planarization dielectric layer 60. For example, the planarization dielectric layer 60 can include silicon oxide or organosilicate glass (OSG), and the gate spacers 56 can include silicon nitride. The gate spacer 56 is formed directly on sidewalls of the source regions (30S, 30S') and the drain regions (30D, 30D'). The thickness of the gate spacers 56 can be in a range from 1 nm to 30 nm, although lesser and greater thicknesses can also be employed.

The gate spacers 56 can be formed on the sidewalls of the gate cavities 49 after formation of the contoured semiconductor region 30B. A vertical distance between a top surface of the contoured channel region 30B and a top surface of the insulator layer 20 increases with a lateral distance from each sidewall of the first source regions 30S and the first drain region 30D' that contacts the gate spacer 56 over the peripheral sub-portions 22S of the faceted dielectric material portion 22. The contoured semiconductor region 30B laterally contacts the first source region 30S and the first drain region 30D. The planar semiconductor region 30B' laterally contacts the second source region 30S' and the second drain region 30D'.

Referring to FIGS. 11A-11D, gate structures (50, 52) including a gate dielectric 50 and a gate electrode 52 can be formed to fill each gate cavity 49. The gate structures (50, 52) can be formed, for example, by depositing a stack of a gate dielectric layer and a gate conductor layer to fill the gate cavities 49, and by removing excess portions of the gate dielectric layer and the gate conductor layer from above the top surface of the planarization dielectric layer 60.

The gate dielectric layer can include a dielectric oxide and/or a dielectric nitride of a semiconductor material (such as silicon oxide and/or silicon nitride), and/or can include a dielectric metal oxide or a dielectric metal nitride (such as $HfO_2$, $ZrO_2$, $HfO_xN_y$, $ZrO_xN_y$) or any other high dielectric constant (high-k) gate dielectric material having a dielectric constant greater than 7.9 as known in the art. The gate dielectric layer can be formed by thermal and/or plasma oxidation, thermal and/or plasma nitridation, atomic layer deposition (ALD), chemical vapor deposition (CVD), or a combination thereof. The thickness of the gate dielectric layer can be from 1 nm to 6 nm, although lesser and greater thicknesses can also be employed. The gate conductor layer includes at least one conductive material, which can be at least one doped semiconductor material and/or at least one metallic material.

The contoured semiconductor region 30B functions as the channel region of a first field effect transistor in the first device region 100, and the planar semiconductor region 30B' functions as the channel region of a second field effect transistor in the second device region 200. The first exemplary semiconductor structure includes a first source region 30S located on the insulator layer 20, a first drain region 30D located on the insulator layer 20, a faceted dielectric material portion 22 located on the insulator layer 20 and having a varying thickness tv. The varying thickness increases with a lateral distance from a periphery P of the faceted dielectric material portion 22 at peripheral sub-portions 22S of the faceted dielectric material portion 22 that adjoin the first source region 30S or the first drain region 30D. A channel region, i.e., the contoured semiconductor region 30B, includes a single crystalline semiconductor material and laterally contacts the first source region 30S and the first drain regions 30D. The gate dielectric 50 of the first field effect transistor has a bottommost surface that contacts the top surface of the contoured semiconductor region 30B. The gate electrode 52 of the first field effect transistor is vertically spaced from the contoured semiconductor region 30B by the gate dielectric 50.

In one embodiment, the faceted dielectric material portion 22 is single crystalline, and the contoured semiconductor region 30B is single crystalline and is epitaxially aligned to the crystallographic structure of the faceted dielectric material portion 22. In one embodiment, the insulator layer 20 is single crystalline, and the faceted dielectric material portion 22 is epitaxially aligned to the crystallographic structure of the insulator layer 20. In one embodiment, the insulator layer 20 is single crystalline, and each of the source regions (30S, 30S') and the drain regions (30D, 30D') is single crystalline and is epitaxially aligned to the crystallographic structure of the insulator layer 20.

The gate spacer 56 laterally surrounds at least a lower portion of the gate electrode 52, and contacts sidewalls of the source regions (30S, 30S') and the drain regions (30D, 30D') in each of the first and second field effect transistors. A portion of the gate dielectric 50 overlies the gate spacer 56, and includes outer sidewalls that are vertically coincident with outer sidewalls of the gate spacer 56 in each of the first and second field effect transistors. A dielectric material layer, i.e., the planarization dielectric layer 60, has a top surface that is coplanar with the top surface of a gate electrode 52 in each of the first and second field effect transistors. The first source region 30S and the first drain regions 30D can have a doping of the opposite conductivity type than the contoured channel region 30B. Likewise, the second source region 30S' and the second drain region 30D' can have a doping of the opposite conductivity type than the planar channel region 30B'.

Referring to FIGS. 12A-12C, a second exemplary semiconductor structure according to a second embodiment of the present disclosure can be derived from the first exemplary semiconductor structure of FIGS. 9A-9D. Specifically, a patterned photoresist layer 77 is formed over the contoured semiconductor region 30B and the planar semiconductor region 30B' as provided in the first exemplary semiconductor structure of FIGS. 9A-9D. The patterned photoresist layer 77 can be formed by applying a blanket (unpatterned) photoresist layer in the gate cavities 47 and over the planarization dielectric layer 60, and by lithographically patterning the blanket photoresist layer employing methods known in the art. In one embodiment, the patterned photoresist layer 77 does not cover the entirety of the area of the cavity 47 in the first device region 100 or the entirety of the area of the cavity 47 in the second device region 200.

The contoured semiconductor region 30B and the planar semiconductor region 30B' as provided in the first exemplary structure of FIGS. 9A-9D are patterned into at least one contoured semiconductor region 30B and at least one planar semiconductor region 30B', respectively, by transfer of the pattern in the patterned photoresist layer 77 employing an anisotropic etch while the patterned photoresist layer 77 is employed as an etch mask. In one embodiment, each of the at least one contoured semiconductor region 30B can have a rectangular shape in a top-down view, and each of the at least one planar semiconductor region 30B' can have a rectangular shape in a top-down view. In one embodiment, each of the at least one contoured semiconductor region 30B can have the same width throughout, and each of the at least one planar semiconductor region 30B' can have the same width throughout. In one embodiment, the at least one contoured semiconductor region 30B can be a plurality of contoured semiconductor regions, and the at least one planar semiconductor region 30B' can be a plurality of planar semiconductor regions.

Referring to FIGS. 13A-13D, the patterned photoresist layer 77 can be removed, for example, by ashing.

Referring to FIGS. 14A-14D, the processing steps of FIGS. 10A-10D and 11A and 11D can be sequentially performed to form the second exemplary semiconductor structure illustrated in FIGS. 14A-14D. A first field effect transistor is formed in the first device region 100, and a second field effect transistor is formed in the second device region 200. Each of the at least one contoured semiconductor region 30B functions as a channel region of the first field effect transistor, and each of the at least one planar semiconductor region 30B' functions as a channel region of the second field effect transistor.

The second exemplary semiconductor structure includes a faceted dielectric material portion 22 located on an insulator layer 20 and having faceted non-horizontal surfaces, at least one channel region 30B located on the faceted dielectric material portion 22 and including a semiconductor material, and a first source region 30S and a first drain region 30D located on the insulator layer 20 and laterally contacting the at least one channel region. The faceted dielectric material portion 22 includes a sub-portion having a varying thickness that increases with a lateral distance from one of the first source region 30S and the first drain region 30D.

In one embodiment, edges of faceted surfaces of the faceted dielectric material portion 20 constitute a contiguous periphery within a horizontal plane including the top surface of the insulator layer 20. In one embodiment, each of the at least one channel region in the first field effect transistor can include a first portion adjoining the first source region 30S and including a first bottom surface that diverges from the horizontal plane including the top surface of the insulator layer 20 with a lateral distance from the first source region 30S, and a second portion adjoining the first drain region 30D and including a second bottom surface that diverges from the horizontal plane with a lateral distance from the first drain region 30D. In one embodiment, each of the at least one channel region in the first field effect transistor can further include a third portion adjoining the first portion and the second portion and having a horizontal bottom surface that is vertically spaced from the top surface of the insulator layer 20 by the thickness of the third portion.

In one embodiment, the at least one channel region in the first field effect transistor can be a plurality of channel regions. The first field effect transistor can include a gate dielectric 50 having a set of bottom surfaces that contact faceted surface of the faceted dielectric material portion 22. The gate dielectric 50 can further contact sidewall surfaces and a top surface of each of the at least one channel region.

The second field effect transistor includes at least one channel region, i.e., the at least one planar semiconductor region 30B', that contacts a planar top surface of the insulator layer 20 and including the same semiconductor material as the at least one channel region of the first field effect transistor. The entirety of each top surface of the at least one channel region of the second field effect transistor can be horizontal. A second source region 30S' and a second drain region 30D' can be located on the insulator layer 20, and can laterally contact the at least one channel region of the second field effect transistor.

The effective channel length of each contoured semiconductor region 30B in the first field effect transistor is greater than the lateral separation distance between the first source region 30S and the first drain region 30D due to the non-linear current conduction path within each contoured semiconductor region 30B. The effective channel length of each contoured semiconductor region 30B in the first field effect transistor is approximately the same as the combined lengths of the segments of the top surface of the contoured semiconductor region 30B. In contrast, the effect channel length of each planar semiconductor region 30B' in the second field effect transistor is the same as the lateral separation distance between the second source region 30S' and the second drain region 30D'.

Because the materials of the source regions (30S, 30S') and the drain regions (30D, 30D') are formed prior to formation of the at least one contoured planar channel region 30B, the at least one planar channel region 30B', and the gate electrode 52, dopant activation in the source regions (30S, 30S') and the drain regions (30D, 30D') can be performed without regard to any thermal constraint on the channel regions (30B, 30B') and the gate electrode 52. Further, the source regions (30S, 30S') and the drain regions (30D, 30D') are self-aligned to the channel regions (30B, 30B') and the gate electrode 52 with minimal diffusion of electrical dopants into the channel regions (30B, 30B').

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
a faceted dielectric material portion located on an insulator layer and having faceted non-horizontal surfaces;
at least one channel region located on said faceted dielectric material portion and including a semiconductor material; and
a source region and a drain region located on said insulator layer and laterally contacting said at least one channel region, wherein said faceted dielectric material portion includes sub-portions having a varying thickness that increases with a lateral distance from one of said source region and said drain region.

2. The semiconductor structure of claim 1, wherein edges of faceted surfaces of said faceted dielectric material portion constitute a contiguous periphery within a horizontal plane including a top surface of said insulator layer.

3. The semiconductor structure of claim 2, wherein each of said at least one channel region comprises:
a first portion adjoining said source region and including a first bottom surface that diverges from said horizontal plane with a lateral distance from said source region; and
a second portion adjoining said drain region and including a second bottom surface that diverges from said horizontal plane with a lateral distance from said drain region.

4. The semiconductor structure of claim 3, wherein each of said at least one channel region further comprises a third portion adjoining said first portion and said second portion and having a horizontal bottom surface.

5. The semiconductor structure of claim 1, wherein said at least one channel region is a plurality of channel regions.

6. The semiconductor structure of claim 1, further comprising a gate dielectric having a set of bottom surfaces that contact faceted surface of said faceted dielectric material portion.

7. The semiconductor structure of claim 1, wherein said gate dielectric further contacts sidewall surfaces and a top surface of each of said at least one channel region.

8. The semiconductor structure of claim 1, further comprising at least another channel region contacting a planar top surface of said insulator layer and including said semiconductor material.

9. The semiconductor structure of claim 8, wherein an entirety of each top surface of said at least another channel region is horizontal.

10. The semiconductor structure of claim 8, further comprising another source region and another drain region located on said insulator layer and laterally contacting said at least another channel region.

11. The semiconductor structure of claim 1, wherein said faceted dielectric material portion is single crystalline, and each of said at least one channel region is single crystalline and is epitaxially aligned to a crystallographic structure of said faceted dielectric material portion.

12. A method of forming a semiconductor structure comprising:
forming a source region and a drain region separated by a cavity therebetween on a top surface of an insulator layer, wherein said forming said source region and said drain region comprises forming a doped semiconductor material portion on said insulator layer, and separating said doped semiconductor material portion into said source region and said drain region by etching a sub-portion of said doped semiconductor material portion;
growing a faceted dielectric material portion on a portion of said top surface of said insulator layer between said source region and said drain region, wherein said faceted dielectric material portion includes sub-portions having a varying thickness that increases with a lateral distance from one of said source region and said drain region;
growing a contoured semiconductor region comprising a semiconductor material from a top surface of said faceted dielectric material portion within said cavity; and
forming at least one channel region by patterning said semiconductor material region.

13. The method of claim 12, further comprising:
forming a disposable gate structure over said doped semiconductor material portion;
forming a dielectric material layer over said doped semiconductor material portion and around said disposable gate structure; and
removing said disposable gate structure and said sub-portion of said doped semiconductor material portion, wherein said cavity is formed in a volume from which said disposable gate structure and said sub-portion of said doped semiconductor material portion are removed.

14. The method of claim 12, further comprising growing a planar semiconductor region comprising said semiconductor material from another portion of said top surface of said insulator layer.

15. The method of claim 14, wherein said planar semiconductor region is grown concurrently with growth of said contoured semiconductor region.

16. The method of claim 12, further comprising:
forming another source region and another drain region separated by another cavity therebetween on said top surface of an insulator layer; and
forming a planar semiconductor region directly on another portion of said top surface of said insulator layer, said planar semiconductor region laterally contacting said source region and said drain region.

17. The method of claim 16, further comprising:
depositing an amorphous material layer on said portion and said another portion of said top surface of said insulator layer; and
removing a portion of said amorphous material layer from above said portion of said top surface of said insulator layer, while not removing another portion of said amorphous material layer from above said another portion of said top surface of said insulator layer.

18. The method of claim 17, wherein said another portion of said amorphous material layer is present on said another portion of said top surface of said insulator layer while said faceted dielectric material portion is grown.

19. The method of claim 12, wherein said insulator layer is provided as a single crystalline insulator layer, and said faceted dielectric material portion is epitaxially aligned to a crystallographic structure of said single crystalline insulator layer.

20. A method of forming a semiconductor structure comprising:
forming a source region and a drain region separated by a cavity therebetween on a top surface of an insulator layer;
growing a faceted dielectric material portion on a portion of said top surface of said insulator layer between said source region and said drain region, wherein said faceted dielectric material portion includes sub-portions having a varying thickness that increases with a lateral distance from one of said source region and said drain region;

growing a contoured semiconductor region comprising a semiconductor material from a top surface of said faceted dielectric material portion within said cavity;

growing a planar semiconductor region comprising said semiconductor material from another portion of said top surface of said insulator layer; and forming at least one channel region by patterning said semiconductor material region.

* * * * *